(12) United States Patent
Chino

(10) Patent No.: US 7,985,629 B2
(45) Date of Patent: Jul. 26, 2011

(54) RESIN SEALING METHOD OF SEMICONDUCTOR DEVICE

(75) Inventor: Teruaki Chino, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 55 days.

(21) Appl. No.: 12/644,477

(22) Filed: Dec. 22, 2009

(65) Prior Publication Data

US 2010/0167469 A1    Jul. 1, 2010

(30) Foreign Application Priority Data

Dec. 25, 2008 (JP) ................................ 2008-328904

(51) Int. Cl.
 *H01L 121/00* (2006.01)
(52) U.S. Cl. ........ 438/124; 438/108; 438/110; 438/113; 438/118; 438/121; 438/125; 438/126; 438/127; 438/464; 438/778; 438/780
(58) Field of Classification Search .................. 438/108, 438/110, 113, 118, 121, 124–127, 464, 778, 438/780
See application file for complete search history.

(56) References Cited

U.S. PATENT DOCUMENTS

| 7,863,745 B2 * | 1/2011 | Nomoto et al. ............... 257/758 |
| 2004/0097017 A1 * | 5/2004 | Shimanuki ..................... 438/124 |
| 2004/0110319 A1 * | 6/2004 | Fukutomi et al. ............. 438/106 |
| 2004/0145044 A1 * | 7/2004 | Sugaya et al. ................. 257/698 |
| 2006/0030075 A1 * | 2/2006 | Sugiyama et al. ............. 438/108 |
| 2006/0063312 A1 * | 3/2006 | Kurita ........................... 438/127 |

FOREIGN PATENT DOCUMENTS

JP           4-283987       10/1992

* cited by examiner

*Primary Examiner* — Kevin M Picardat
*Assistant Examiner* — Bac H Au
(74) *Attorney, Agent, or Firm* — Rabin, Hill & Clark LLP

(57) ABSTRACT

A resin sealing method of a semiconductor device, is provided with: providing a semiconductor device on which a dummy dump is formed; providing a support body including an adhesive layer provided on a surface of the support body; forming a recess in the adhesive layer; inserting the dummy bump of the semiconductor device into the recess of the adhesive layer; adhering the semiconductor device to the adhesive layer with the semiconductor device positioned on the support body; setting the supporting body having the semiconductor device in a resin sealing mold; supplying a resin into a cavity of the resin sealing mold; sealing the semiconductor device with the resin on the support body while using the dummy bump to inhibit displacement of the semiconductor device caused by a flow of the resin supplied into the cavity of the resin sealing mold; and removing the support body, the adhesive layer, and the dummy bump from the semiconductor device sealed with the resin.

8 Claims, 10 Drawing Sheets

RESIN SEALING METHOD OF SEMICONDUCTOR DEVICE

This application claims priority from Japanese Patent Application No. 2008-328904, filed on Dec. 25, 2008, the entire contents of which are hereby incorporated by reference.

FIELD OF THE INVENTION

The present disclosure relates to a resin sealing method of a semiconductor device and more particularly to a resin sealing method of a semiconductor device for making it possible to prevent displacement of the semiconductor device at the resin sealing time when the semiconductor device disposed at a predetermined position of a support plate is sealed with a resin.

DESCRIPTION OF RELATED ART

There is a wafer level molding method of positioning and disposing electrode terminals formed on one side of a plurality of semiconductor devices with the electrode terminals aimed at an adhesive film applied onto a support body and then sealing an opposite side of the semiconductor devices with a resin in a collective manner. In the wafer level molding method, there are a transfer molding method of injecting a seal resin from a side face of semiconductor devices positioned and disposed on a support body and sealing the semiconductor devices with the seal resin and a compression molding method of supplying a seal resin from an upper face of semiconductor devices positioned and disposed on a support body and compressing the seal resin and the semiconductor devices up and down, thereby sealing the semiconductor devices with the seal resin.

As a related art of the wafer level molding method of semiconductor devices, Japanese Patent Application Publication No. JP-A-1992-283987 discloses a method of applying an epoxy-based adhesive layer onto a support substrate of a metal substrate and positioning and disposing external electrode terminals of semiconductor devices on the uncured adhesive layer with the external electrode terminals aimed at the adhesive layer and then sealing the semiconductor devices disposed on the support body with an insulating resin and peeling off the support substrate from the insulating resin and then removing the adhesive layer and exposing the external electrode terminals before connecting a wiring circuit and external connection bumps to the external electrode terminals.

As disclosed in JP-A-1992-283987, since a wiring circuit is formed in the external electrode terminals of the semiconductor devices sealed with resin, often the adhesive layer does not have a so strong adhesive force so as to facilitate peeling off the external electrode terminals of the semiconductor devices and the adhesive layer. In recent years, one support substrate has been formed large and the number of semiconductor devices mounted on the support substrate has increased; there is a problem of displacement of the semiconductor devices caused by a resin flow at the resin sealing time of the semiconductor devices regardless of the compression molding method or the transfer molding method. Such displacement of the semiconductor devices makes it impossible to form micro wiring after resin seal and results in defectives of most or all of the semiconductor devices on the support substrate; it leads to reduction in yield and poor economy.

SUMMARY OF INVENTION

Illustrative aspects of the present invention provide a resin sealing method of a semiconductor device for sealing a semiconductor device with a resin at an accurate position without causing displacement of the semiconductor device on a support plate from the initial adhesion position by the fluid power of the seal resin when the semiconductor device disposed at a predetermined position of the support plate is sealed with the resin.

According to a first aspect of the invention, a resin sealing method of a semiconductor device, is provided with: providing a semiconductor device on which a dummy dump is formed; providing a support body including an adhesive layer provided on a surface of the support body; forming a recess in the adhesive layer; inserting the dummy bump of the semiconductor device into the recess of the adhesive layer; adhering the semiconductor device to the adhesive layer with the semiconductor device positioned on the support body; setting the supporting body having the semiconductor device in a resin sealing mold; supplying a resin into a cavity of the resin sealing mold; sealing the semiconductor device with the resin on the support body while using the dummy bump to inhibit displacement of the semiconductor device caused by a flow of the resin supplied into the cavity of the resin sealing mold; and removing the support body, the adhesive layer, and the dummy bump from the semiconductor device sealed with the resin.

Other aspects and advantages of the invention will be apparent from the following description, the drawings and the claims.

DETAILED DESCRIPTION OF EXEMPLARY EMBODIMENTS

First Exemplary Embodiment

Figure 1A:
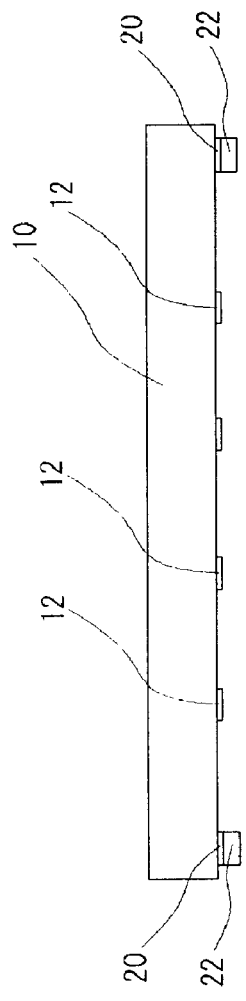
FIG. 1A is a front view to show a semiconductor device according to a first exemplary embodiment of the invention.
Figure 1B:
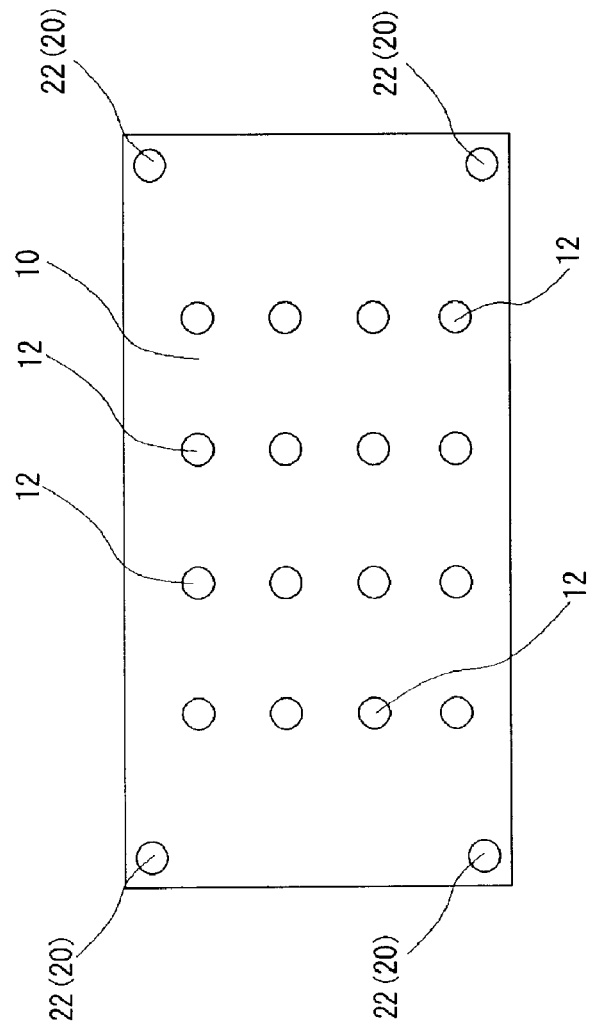
FIG. 1B is a bottom plan view the semiconductor device shown in FIG. 1A.

A resin sealing method of a semiconductor device according to a first exemplary embodiment of the invention will be discussed. FIG. 1A is a front view to show a semiconductor device according to the first exemplary embodiment of the invention, and FIG. 1B is a bottom plan view the semiconductor device shown in FIG. 1A.

First, a treatment method (working method) for a semiconductor device 10 will be discussed. The semiconductor device 10 is formed with dummy bumps 22 at periphery positions of a face where electrode terminals 12 of the semiconductor device 10 are formed, as shown in FIGS. 1A and 1B. Each of the electrode terminals 12 in the first exemplary embodiment is formed so as to project from a bottom face of the semiconductor device 10. Each of the dummy bumps 22 is stacked on a dummy pad 20 provided on the face side where the electrode terminals 12 of the semiconductor device 10 are formed to prevent damage to the semiconductor device 10 by etching because the dummy bumps 22 are removed by etching after the semiconductor device 10 is sealed with resin. In the first exemplary embodiment, a gold film is used as the dummy pad 20 and a copper bump is used as the dummy bump 22. The dummy pad 20 and the dummy bump 22 are provided at every corner of the semiconductor device 10 having a planar shape formed as a rectangle, but may be disposed at least two points for the semiconductor device 10. In this case, preferably, the dummy bumps are disposed at two points on a diagonal line connecting the corners of the semiconductor device 10. The dummy pad 20 is formed having the same thickness dimension as the projection height of the electrode terminal 12, and the total of the height dimensions of the dummy pad 20 and the dummy bump 22 is formed equal to the lay thickness dimension of an adhesive layer 40 as shown FIG. 3B. Although FIGS. 1A and 1B show the semiconductor device 10 separated as one piece, the dummy pads 20 and the dummy bumps 22 can be formed in batch by using photolithography, plating processing, etc., before the semiconductor devices 10 are separated.

Figure 2A:
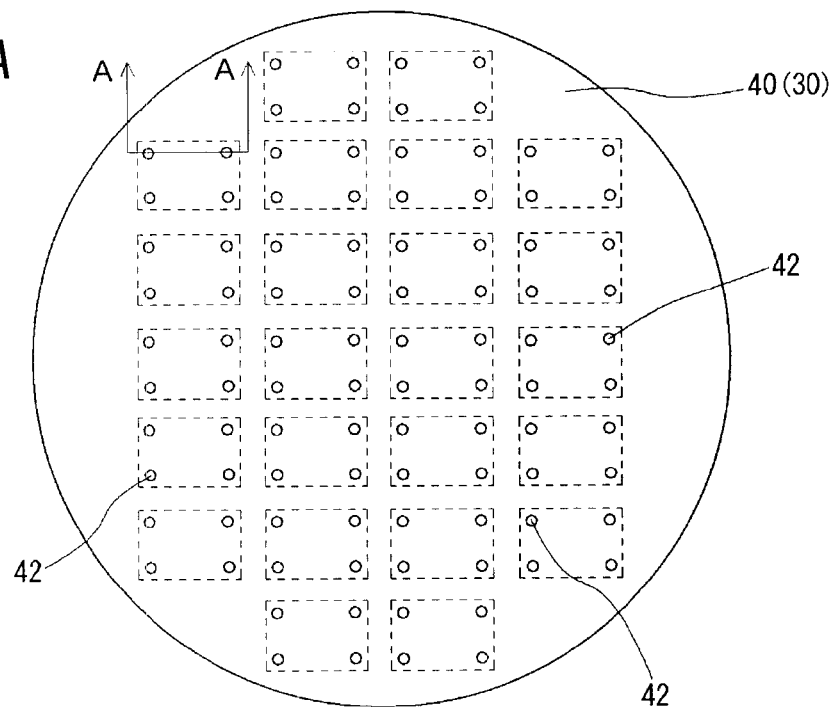
FIG. 2A is a plan view to show a state in which an adhesive layer is formed on a support body.
Figure 2B:
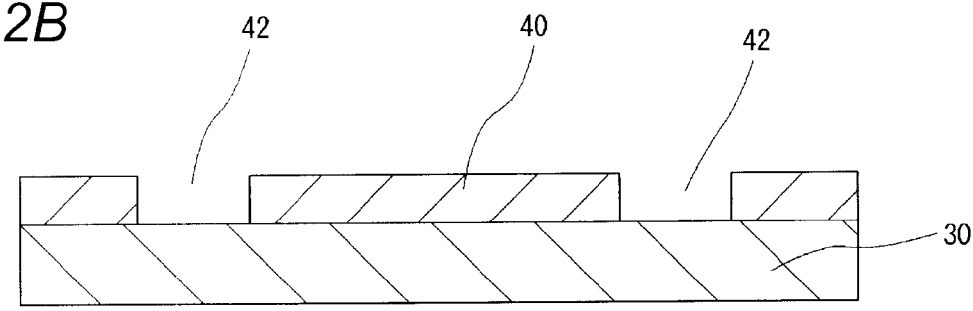
FIG. 2B is a sectional view taken on line A-A of FIG. 2A.
Figure 3A:
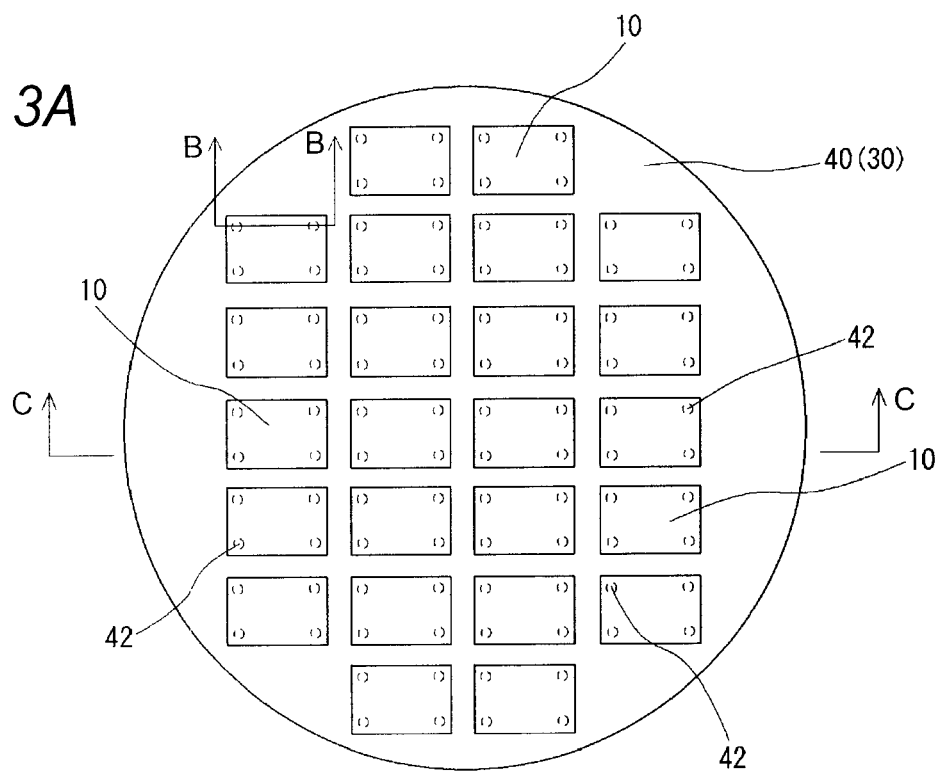
FIG. 3A is a plan view to show a state in which semiconductor devices are disposed after the adhesive layer is formed.
Figure 3B:
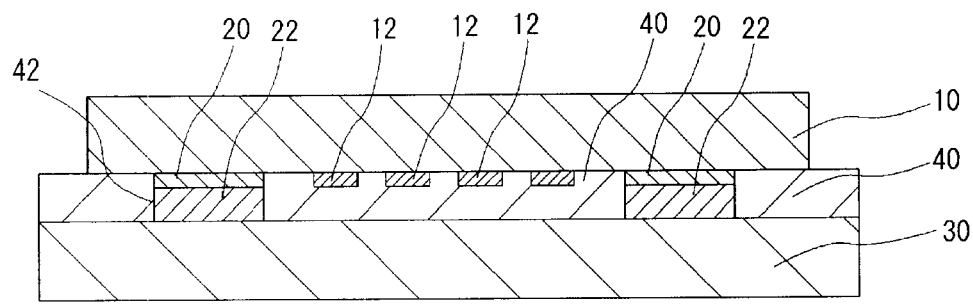
FIG. 3B is a sectional view taken on line B-B of FIG. 3A.
Figure 4A:
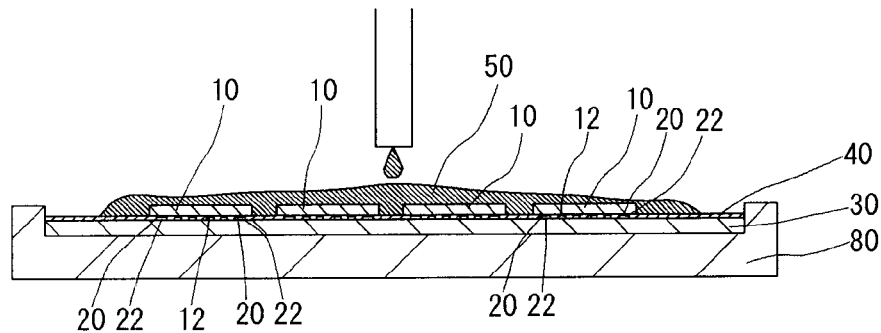
FIGS. 4A to 4C are sectional views taken on line C-C of FIG. 3A to show a state in which semiconductor devices are sealed with resin by compression mold.
Figure 4B:
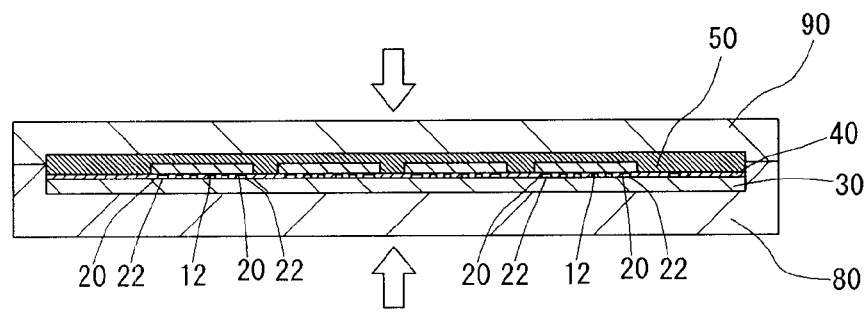
Figure 4C:
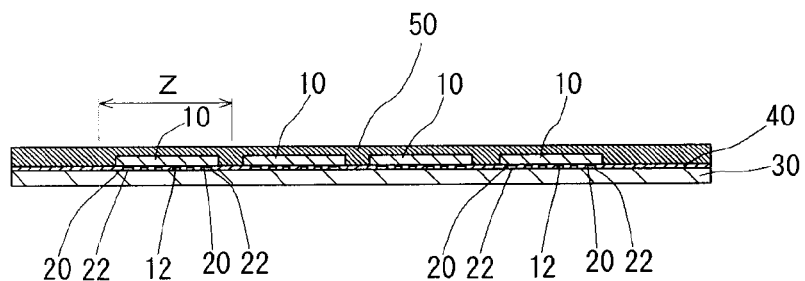

Thus, the semiconductor device 10 formed with the dummy bumps 22 on the face side where the electrode terminals 12 are formed is positioned on the adhesive layer 40 applied to a support body 30 and is adhered to the adhesive layer 40. The support body 30 and the adhesive layer 40 will be discussed below: FIG. 2A is a plan view to show a state in which an adhesive layer is formed on a support body, and FIG. 2B is a sectional view taken on line A-A of FIG. 2A. The dashed line in FIG. 2A indicates the position where the semiconductor device 10 is disposed. FIG. 3A is a plan view to show a state in which semiconductor devices are disposed after the adhesive layer is formed, and FIG. 3B is a sectional view taken on line B-B of FIG. 3A. FIGS. 4A to 4C are sectional views taken on line C-C of FIG. 3A to show a state in which semiconductor devices are sealed with resin by compression mold.

As shown in FIG. 2A, the adhesive layer 40 is applied to an upper face side of the support body 30 formed like a thin disk using a metal plate. A thin copper plate is used as the support body 30 and an epoxy-based adhesive is used as the adhesive layer 40. The layer thickness dimension of the adhesive layer 40 in the first exemplary embodiment is 30 μm. After the adhesive layer 40 is formed on the support body 30, recesses 42 are formed in the adhesive layer 40 as shown in FIG. 2B. The recesses 42 can be formed using a laser irradiation working method. If the adhesive layer 40 is photosensitive, the recesses 42 can also be formed using photolithography. The recesses 42 are formed at the positions corresponding to the positions of the dummy bumps 22 formed on the semiconductor device 10. The recesses 42 in the first exemplary embodiment pierce the adhesive layer 40 in the thickness direction thereof, and the surface of the support body 30 is exposed on the bottom faces of the recesses 42.

After the recesses 42 are formed in the adhesive layer 40, the semiconductor devices 10 are disposed as shown in FIGS. 3A and 3B. Each of the semiconductor devices 10 is disposed as the dummy bumps 22 are positioned in the recesses 42 formed in the adhesive layer 40 and the dummy bumps 22 and the dummy pads 20 are fitted into the recesses 42. Since the total height dimension of each dummy bump 22 and each dummy pad 20 are formed equal to the depth dimension of the recess 42, the semiconductor device 10 is pressed against the adhesive layer 40, whereby the semiconductor device 10 can be disposed in a state in which the face of the semiconductor device 10 where the electrode terminals 12 are formed is intimately contacted with the surface of the adhesive layer 40. Although the electrode terminals 12 project on the bottom face of the semiconductor device 10, the projection height of the electrode terminal 12 is extremely small. Thus, if the semiconductor device 10 is pressed against the adhesive layer 40, the adhesive layer 40 follows the faces of the electrode terminals 12, whereby the bottom face of the semiconductor device 10 and the adhesive layer 40 can be intimately contacted with each other. Thus, the semiconductor devices 10 are adhered to the adhesive layer 40 applied to the support body 30 in the positioned state, and the dummy bumps 22 are fitted into the recess 42, whereby the semiconductor devices 10 and the support body 30 can be put into one body. The semiconductor devices 10 and the support body 30 put into one body are set in a lower mold 80 of a resin molding mold, and a seal resin 50 is supplied to the top faces of the semiconductor devices 10, as shown in FIG. 4A. Although a liquid resin is shown as the seal resin 50 in FIG. 4A, the seal resin 50 may be a granular resin. After the seal resin 50 is supplied, an upper mold 90 of the resin molding mold is abutted against the lower mold 80, and the seal resin 50 is heated and pressurized together with the lower mold 80 and the upper mold 90 (undergoes compression molding), whereby the seal resin 50 is cured and the top face sides of the semiconductor devices 10 are sealed with the seal resin 50, as shown in FIG. 4B.

Figure 5A:
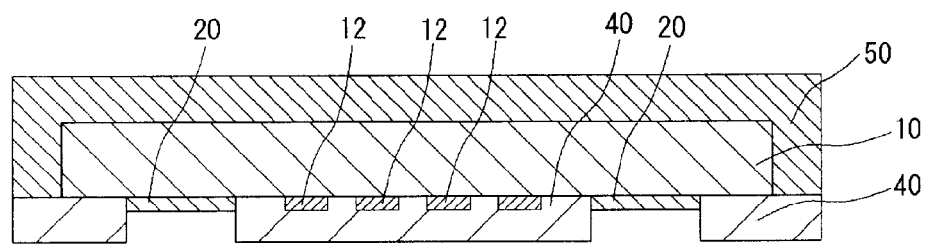
FIGS. 5A and 5B are enlarged views in the range of an arrow Z in FIG. 4C.
Figure 5B:
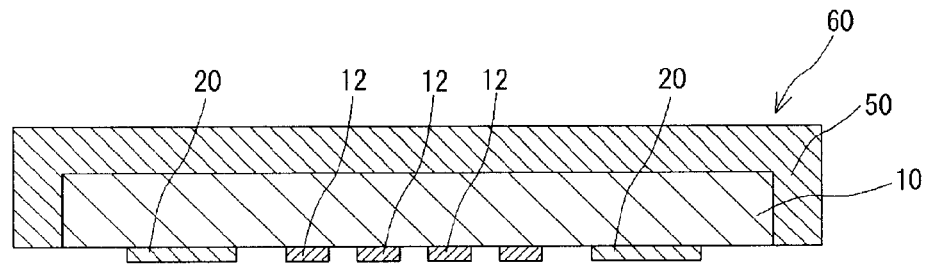

After the semiconductor devices 10 are resin-sealed, the resin-sealed semiconductor devices 10 are taken out from the female mold 80 together with the support body 30 as shown in FIG. 4C. And then, the support body 30 is removed. The support body 30 is removed by etching. In the first exemplary embodiment, since the support body 30 and the dummy bumps 22 are formed of copper, an etchant (etching liquid) for etching copper can be used to selectively etch only the support body 30 and the dummy bumps 22. FIG. 5A is a sectional view to show a state in which the support body 30 and the dummy bumps 22 are thus removed. FIGS. 5A and 5B are enlarged views in the range of an arrow Z in FIG. 4C. When the support body 30 is removed, the adhesive layer 40 and the dummy pads 20 are exposed on the face of the semiconductor device 10 where the electrode terminals 12 are formed.

Next, the adhesive layer 40 is removed by etching or laser irradiation and a semiconductor package 60 shown in FIG. 5B can be provided.

According to the resin sealing method of a semiconductor device according to the first exemplary embodiment, the dummy pads 20 and the dummy bumps 22 of projections formed on one face side of the semiconductor device 10 are fitted into the recesses 42 of the adhesive layer 40 formed on the surface of the support body 30 and act as stoppers. Accordingly, when the semiconductor device 10 is sealed with resin while the opposite face side of the semiconductor device 10 is pressurized, the positioning state of the semiconductor device 10 is not displaced because of fluid power of the seal resin 50 and the semiconductor device 10 can be resin-sealed in a state in which an initial disposed position of the semiconductor device 10 is maintained. Therefore, in the process of re-wiring after the semiconductor device 10 is resin-sealed, there is no fear of displacement of the semiconductor device 10 in the semiconductor package 60 and the manufacturing yield of the semiconductor package 60 formed with a wiring circuit (re-wiring) at the required position can be improved, whereby the semiconductor package 60 is efficiently manufactured. After the semiconductor packages 60 are separated, an external connection bump (not shown) can be connected to the separated semiconductor package 60 for providing a semiconductor device. The semiconductor packages 60 may be stacked in the height direction thereof.

In the first exemplary embodiment, copper bumps are used as the dummy bumps 22, but the dummy bumps 22 are not limited to those made of metal if the dummy bumps 22 have strength resisting the fluid power of the seal resin in a molten state when the semiconductor device 10 is resin-sealed; the dummy bumps 22 may be formed of any other material such as a synthetic resin.

Second Exemplary Embodiment

Figure 6A:
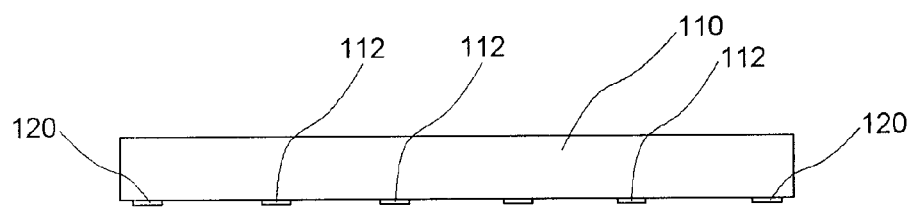
FIG. 6A is a front view to show the work state of a semiconductor device according to a second exemplary embodiment of the invention.
Figure 6B:
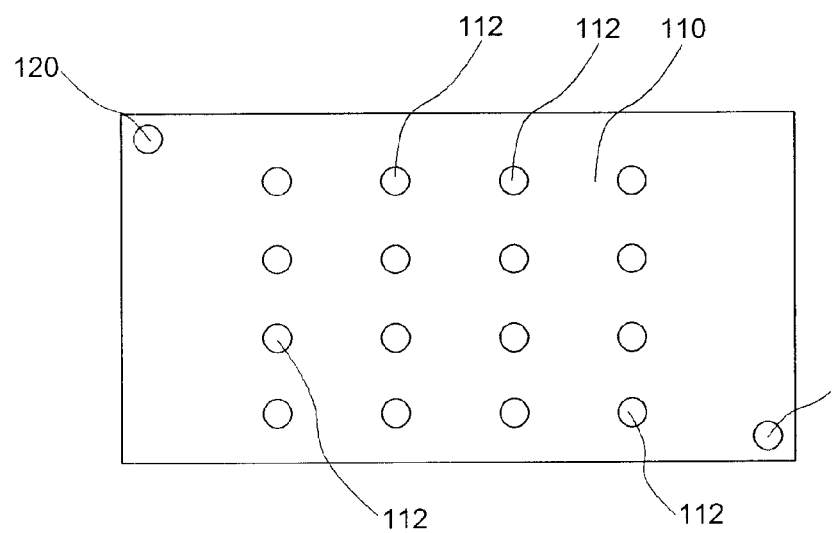
FIG. 6B is a bottom plan view the semiconductor device shown in FIG. 6A.
Figure 7A:
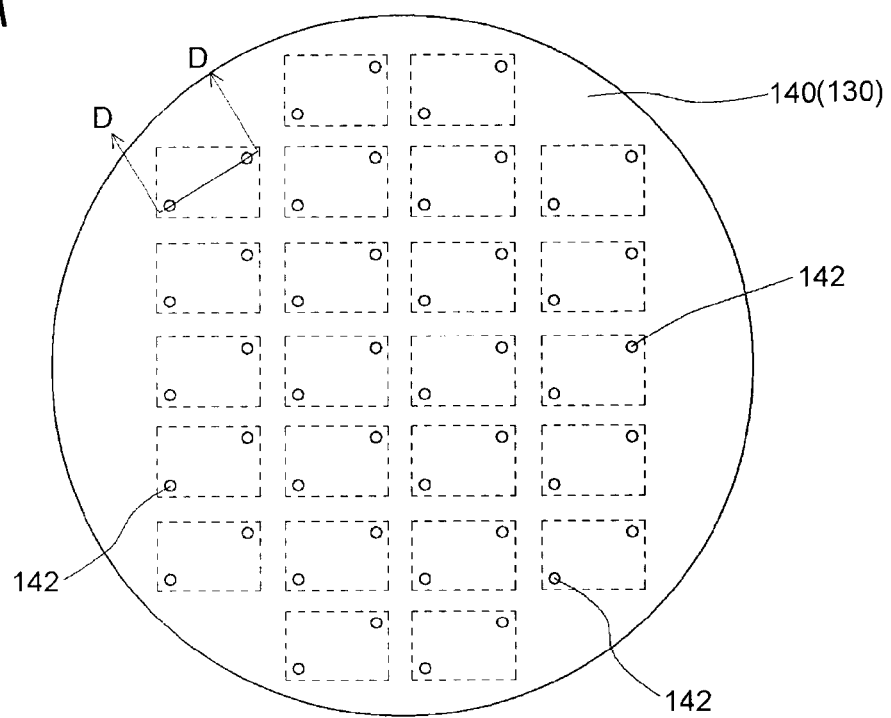
FIG. 7A is a plan view to show a state in which an adhesive layer is formed on a support body.
Figure 7B:
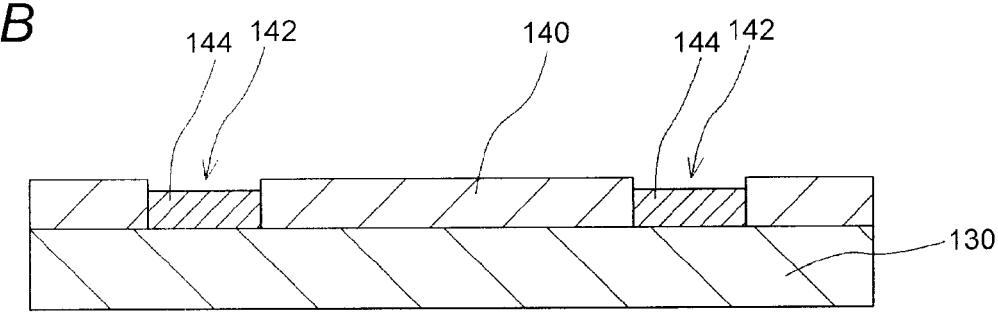
FIG. 7B is a sectional view taken on line D-D of FIG. 7A.

In a second exemplary embodiment of the invention, a resin sealing method of a semiconductor device 110 that can provide the advantages similar to those of the first exemplary embodiment by filling a paste into an adhesive layer 140 formed on a surface of a support body 130 and hardening the filled paste to form a hard body will be discussed. FIG. 6A is a front view to show the work state of a semiconductor device according to the second exemplary embodiment of the invention, and FIG. 6B is a bottom plan view the semiconductor device shown in FIG. 6A. FIG. 7A is a plan view to show a state in which an adhesive layer is formed on a support body, and FIG. 7B is a sectional view taken on line D-D of FIG. 7A. FIGS. 8A to 8D are sectional views taken on line D-D of FIG. 7A to show a state in which semiconductor devices are sealed with resin by compression mold.

The semiconductor device 110 according to the second exemplary embodiment is formed of dummy pads 120 by gold plating, etc., on the face where electrode terminals 112 are formed as with the first exemplary embodiment. The dummy pads 120 can be formed like the dummy pads 20 in the first exemplary embodiment. In the second exemplary embodiment, each dummy pad 120 is formed at two corners on the face of the semiconductor device 110 where the electrode terminals 112 are formed, as shown in FIGS. 6A and 6B.

Next, as shown in FIG. 7A, the adhesive layer 140 is applied to the support body 130 of a thin copper plate and each of recesses 142 is formed in each of the adhesive layer 140 by laser irradiation working method or photolithography in a similar manner to that of the first exemplary embodiment. The positions of the recesses 142 correspond to the positions of the dummy pads 120 formed on the semiconductor device 110. A copper paste 144 is filled into each of the recesses 142. In the second exemplary embodiment, the copper paste 144 is not densely filled into the recesses 142 (the copper paste 144 is not filled to the height position of an upper face opening part of the recess 142). A volume of the copper paste 144 filled into the recesses 142 is as much as the volume resulting from deducting the volume of the dummy pad 120 entering the recess 142, as shown in FIG. 7B. Accordingly, when the dummy pad 120 enters the recess 142, the copper paste 144 does not overflow and the space in the recess 142 can be filled just enough with the copper paste 144 and the dummy pad 120.

Figure 8A:
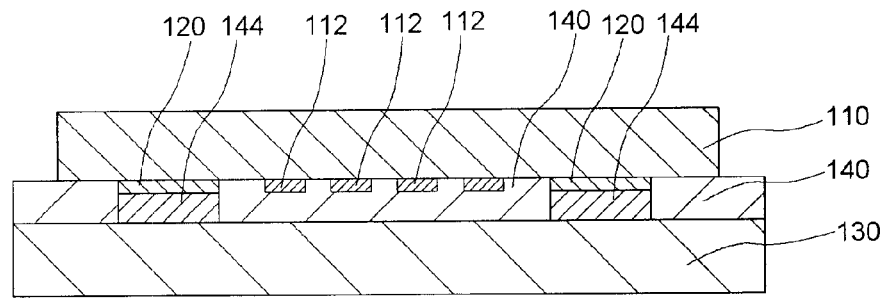
FIGS. 8A to 8D are sectional views taken on line D-D of FIG. 7A to show a state in which semiconductor devices are sealed with resin by compression mold.

As shown in FIG. 8A, the dummy pads 120 of the semiconductor device 110 are positioned in the positions of the copper paste 144 and are entered in the recesses 142 filled with the copper paste 144 And then, the dummy pads 120 are contacted with the copper paste 144. After the semiconductor device 110 is adhered to the adhesive layer 140, the copper paste 144 is heated to form copper bumps 145 of hard bodies. Since the copper bumps 145 are intimately contacted with the dummy pads 120 at the time of the copper paste 144, each of the copper bumps 145 and each of the dummy pads 120 are reliably put into one body for strongly fixing the semiconductor device 110 at a required position of the adhesive layer 140.

Figure 8B:
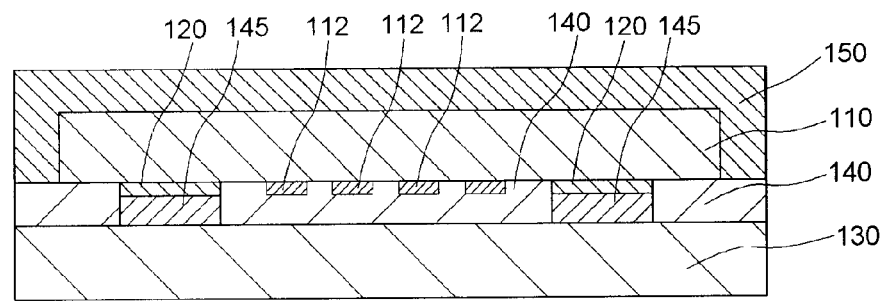

After the semiconductor devices 110 and the adhesive layer 140 are fixed to each other, in a similar manner to that of the first exemplary embodiment (see FIGS. 4A to 4C), the semiconductor devices 110 and the support body 130 (containing the adhesive layer 140, etc.) are set in a lower mold 80 of a resin molding mold and a seal resin 150 is supplied to the top faces of the semiconductor devices 110. And then, an upper mold 90 of the resin molding mold is abutted against the lower mold 80, the seal resin 150 is heated and pressurized with the lower mold 80 and the upper mold 90. The seal resin 150 is widened uniformly in a cavity formed by the lower mold 80 and the upper mold 90 and is thermally cured, whereby the semiconductor device 110 is resin-sealed, as shown in FIG. 8B. In the second exemplary embodiment, the copper bumps 145 are fitted into the recesses 142 of the adhesive layer 140, so that the semiconductor device 110 can resist the fluid power of the seal resin 150 when the semiconductor device 110 is resin-sealed, and the semiconductor device 110 can be resin-sealed in a state in which an initial disposed position of the semiconductor device 110 is maintained.

Figure 8C:
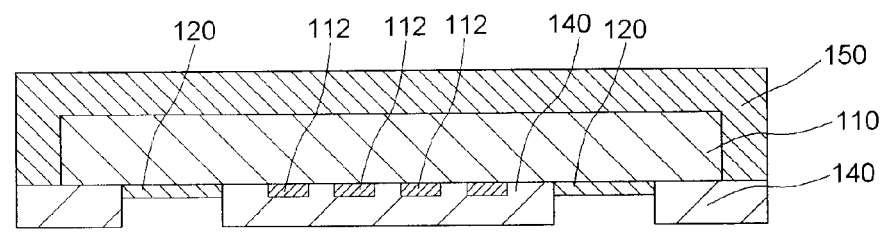
Figure 8D:
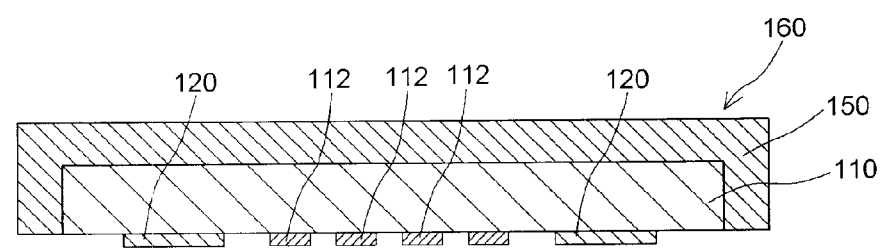

After completion of resin-sealing the semiconductor device 110, the support body 130 is removed as shown in FIG. 8C. An etchant of copper can be used to remove the support body 130 and the copper bumps 145 at once in a similar manner to that of the first exemplary embodiment. After this, processing (treatment) similar to that of the first exemplary embodiment is performed, whereby a semiconductor package 160 shown in FIG. 8D can be provided.

By the first and second exemplary embodiment of the invention is adopted, the positioning state of the adhesive layer applied onto the support body and the semiconductor device can be fixed reliably to the adhesive layer by the dummy bump and the hard body (cured paste). Thus, if a molten resin supplied to the inside of the resin sealing mold is pressed (or transferred) at a high pressure, the positioning state of the semiconductor device and the adhesive layer can be reliably maintained resisting the fluid power of the molten resin. Accordingly, the semiconductor device can be appropriately sealed with the resin. Further, it is made possible to precisely form a micro wiring circuit for every semiconductor device after the resin seal, yield is improved, and it is made possible to efficiently manufacture semiconductor packages and semiconductor products.

While the invention has been described in detail based on the first and second exemplary embodiments shown above, the invention is not limited to the first and second exemplary embodiments. For example, in the exemplary embodiments, copper is used as the dummy bumps 22 and the paste material filled into the recesses 142 of the adhesive layer 140, but the dummy bumps 22 and the paste material filled into the recesses 142 are not limited to copper. Essentially, if the adhesive force with the dummy pads 20 provided on the face of the semiconductor device 10 where the electrode terminals 12 are formed can be made larger than the force acting in the plane direction caused by the flow of the seal resin 50 when the semiconductor device 10 is resin-sealed, and if a hard body which is selectively removable can be provided, any other material than copper (for example, a synthetic resin or a metal material other than copper) can also be used.

In the first exemplary embodiment described above, a mode in which the dummy pads 20 formed on the semiconductor device 10 are formed at the corners of the plane area of the semiconductor device 10 is described, but the invention is not limited to the mode. Essentially, when the semiconductor device 10 is resin-sealed, the positioning state of the semiconductor device 10 adhered to the adhesive layer 40 may be able to be maintained and the dummy pads 20 and the recesses 42 may be formed anywhere if the dummy pads 20 and the recesses 42 are in the plane area of the semiconductor device 10. A mode in which the planar shape of each of the dummy pads 20, the dummy bumps 22, and the recesses 42 is formed as a circle is described in the first exemplary embodiment, but a planer shape of each of dummy pads and dummy bumps may be formed having projections in longitudinal and lateral directions (X axis direction and Y axis direction), such as a letter L or a cross as shown in FIGS. 9A to 9D. Such a shape is adopted, whereby the disposition number of dummy bumps can be reduced.

Figure 9A:
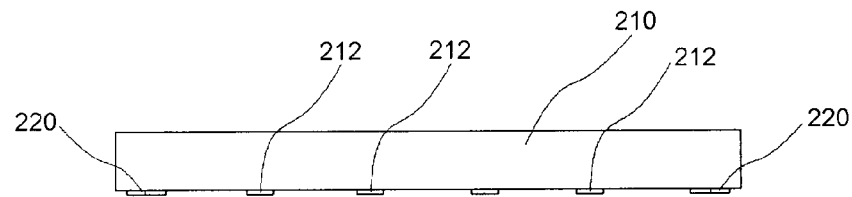
FIG. 9A is a front view of a semiconductor device to show another exemplary embodiment of dummy pads and dummy bumps.
Figure 9B:
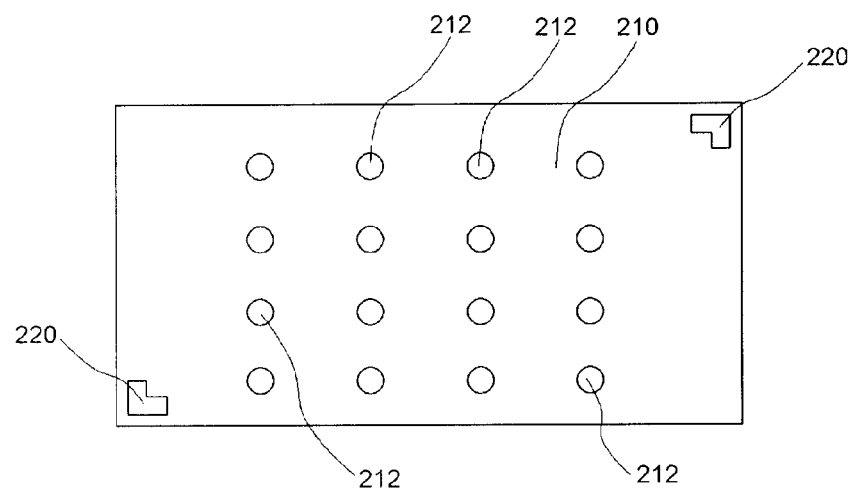
FIG. 9B is a bottom plan view the semiconductor device shown in FIG. 9A.
Figure 9C:
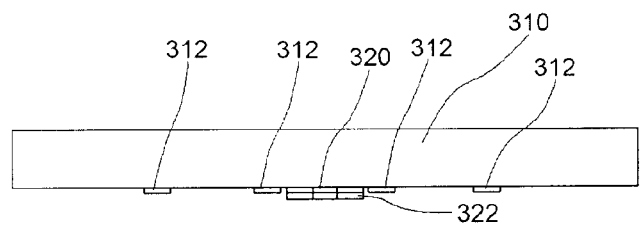
FIG. 9C is a front view of a semiconductor device to show more another exemplary embodiment of dummy pads and dummy bumps.
Figure 9D:
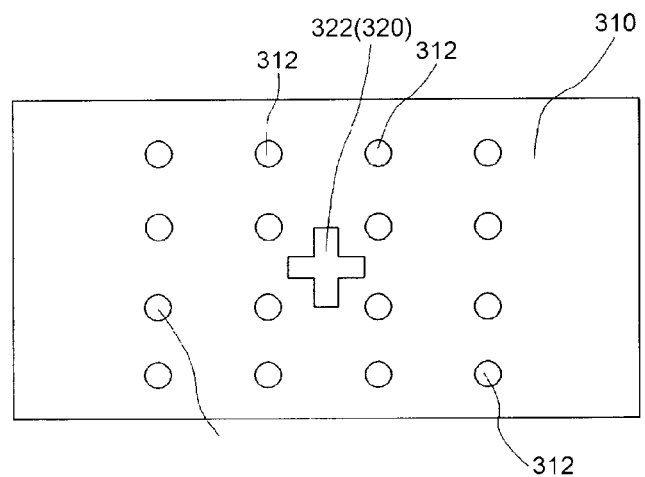
FIG. 9D is a bottom plan view the semiconductor device shown in FIG. 9C.

Particularly, if cross planar shapes of the dummy pads 320, the dummy bumps 322, and the recesses 342 as shown in FIGS. 9C and 9D are adopted, it is extremely advantageous in that the disposition numbers of the dummy pads 320 and the dummy bumps 322 formed on the semiconductor device 310 and the recesses 342 formed in the adhesive layer 340 can be reduced to each one per one semiconductor device 310.

The dummy pads 220 and 320, the dummy bumps 222 and 322, and the recesses 242 and 342 shown in FIGS. 9A to 9D can be easily formed by photolithography.

Figure 10A:
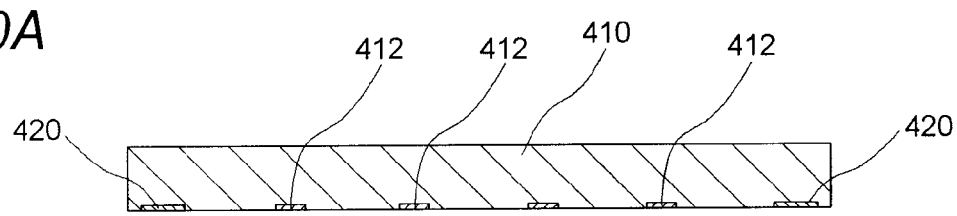
FIGS. 10A and 10B are sectional views to show further another exemplary embodiment of a semiconductor device and a semiconductor package.
Figure 10B:
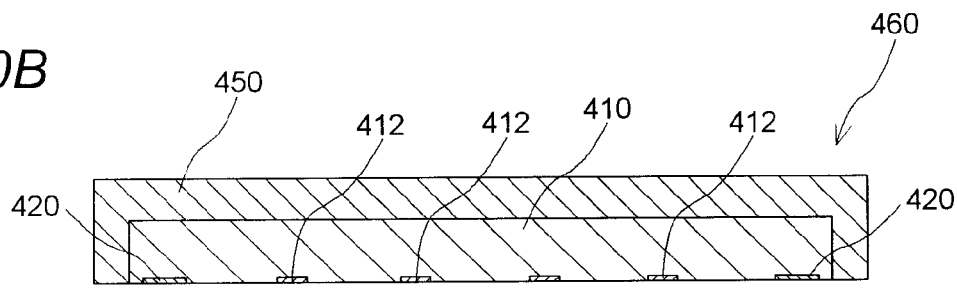

A semiconductor device 410 formed with electrode terminals 412 and dummy pads 420 contained within the thickness of the semiconductor device 410 as shown in FIG. 10A can also be used. In the semiconductor device 410 shown in FIG. 10A, either of the exemplary embodiments described above is applied, whereby a semiconductor package 460 shown in FIG. 10B can also be provided. The semiconductor package 460 shown in FIG. 10B makes it possible to flat the face where the electrode terminals 412 are formed (the bottom face of the semiconductor device 410); it is also advantageous for slimming down the semiconductor package 460 and a semiconductor apparatus using the semiconductor package 460.

It is also possible to previously form the dummy pads 20 and the dummy bumps 22 on the semiconductor device 10 in a discrete state. If the semiconductor device 10 previously formed with the dummy pads 20 and the dummy bumps 22 is fitted into the recesses 42 of the adhesive layer 40 deposited on the support body 30 in a state in which the semiconductor device 10 is housed in a jig (not shown), the later processing (treatment) can be performed in a similar manner to that of the first exemplary embodiment. The dummy bumps 22 and the copper bumps 145 (hard bodies) may be formed on signal pads provided on an active face of the semiconductor device 10 or 110.

Further, in the exemplary embodiments, the compression molding mold is used as the molding mold for resin-sealing the semiconductor device, but the molding mold is not limited to that of the exemplary embodiments and the invention can also be applied when the semiconductor device is resin-sealed by a transfer molding mold.

While the present inventive concept has been shown and described with reference to certain exemplary embodiments thereof, it will be understood by those skilled in the art that various changes in form and details may be made therein without departing from the spirit and scope of the invention as defined by the appended claims.

What is claimed is:

1. A resin sealing method of a semiconductor device, comprising:
    providing a semiconductor device on which a dummy bump is formed;
    providing a support body including an adhesive layer provided on a surface of the support body;
    forming a recess in the adhesive layer;
    inserting the dummy bump of the semiconductor device into the recess of the adhesive layer;
    adhering the semiconductor device to the adhesive layer with the semiconductor device positioned on the support body;
    setting the supporting body having the semiconductor device in a resin sealing mold;
    supplying a resin into a cavity of the resin sealing mold;
    sealing the semiconductor device with the resin on the support body while using the dummy bump to inhibit displacement of the semiconductor device caused by a flow of the resin supplied into the cavity of the resin sealing mold; and
    removing the support body, the adhesive layer, and the dummy bump from the semiconductor device sealed with the resin.

2. The resin sealing method according to claim 1, wherein the semiconductor device includes a dummy pad formed of a material not removed at the same time when the dummy bump is removed by etching, and the dummy bump is formed on the dummy pad.

3. The resin sealing method according to claim 1, wherein the dummy bump is removed at the same time when the support body is removed.

4. The resin sealing method according to claim 1, wherein the dummy bump is formed of the same material as the support body.

5. A resin sealing method of a semiconductor device, comprising:
    providing a semiconductor device;
    providing a support body including an adhesive layer provided on a surface of the support body;
    forming a recess in the adhesive layer;
    filling a paste into the recess;
    adhering the semiconductor device to the adhesive layer with the semiconductor device positioned so as to abut the paste filled into the recess;
    forming a hard body by curing the paste to be integrated with the semiconductor device;
    setting the support body having the semiconductor device in a resin sealing mold;
    supplying a resin into a cavity of the resin sealing mold;
    sealing the semiconductor device with the resin while using the hard body to inhibit displacement of the semiconductor device caused by a flow of the resin supplied into the cavity of the resin sealing mold; and removing the support body, the adhesive layer, and the hard body from the semiconductor device sealed with the resin.

6. The resin sealing method according to claim 5, wherein the semiconductor device includes a dummy pad formed of a material not removed at the same time when the hard body is removed by etching, and the paste forming the hard body is abutted against a surface of the dummy pad.

7. The resin sealing method according to claim 5, wherein the hard body provided in the recess is removed at the same time when the support body is removed.

8. The resin sealing method according to claim 5, wherein the hard body is formed of the same material as the support body.

* * * * *